United States Patent
Wang

(10) Patent No.: US 7,586,771 B2
(45) Date of Patent: Sep. 8, 2009

(54) TREE-STYLE AND-TYPE MATCH CIRCUIT DEVICE APPLIED TO CONTENT ADDRESSABLE MEMORY

(76) Inventor: Jinn-Shyan Wang, Electrical Engineering Department of CCU, 5F-5, 168 San-Hsing, Ming-Hsiung, Chia-Yi (TW)

( * ) Notice: Subject to any disclaimer, the term of this patent is extended or adjusted under 35 U.S.C. 154(b) by 327 days.

(21) Appl. No.: 11/518,447

(22) Filed: Sep. 11, 2006

(65) Prior Publication Data

US 2008/0062742 A1 Mar. 13, 2008

(51) Int. Cl.
*G11C 15/00* (2006.01)
(52) U.S. Cl. .............................. 365/49.16; 365/189.05; 365/189.16
(58) Field of Classification Search .................... 365/49, 365/189.16, 189.05, 49.16
See application file for complete search history.

(56) References Cited

U.S. PATENT DOCUMENTS 5,852,569 A * 12/1998 Srinivasan et al. ....... 365/49.17
5,964,857 A * 10/1999 Srinivasan et al. .......... 710/244
6,433,577 B1 * 8/2002 Wang et al. .................... 326/37
7,200,019 B1 * 4/2007 Bhatia et al. ............. 365/49.17
7,298,636 B1 * 11/2007 Wen et al. ................. 365/49.16
7,414,872 B2 * 8/2008 Wang ....................... 365/49.16
2006/0098468 A1 * 5/2006 Park ............................ 365/49

* cited by examiner

*Primary Examiner*—Tuan T Nguyen
*Assistant Examiner*—Hien N Nguyen
(74) *Attorney, Agent, or Firm*—Rosenberg, Klein & Lee

(57) ABSTRACT

A tree-style AND-type match circuit device applied to the content addressable memory (CAM) is provided. In this tree-style AND-type match circuit device, a plurality of AND-type match circuit groups branchingly connect with each other by a first AND logic gate. The tree-style AND-type match circuit increases the parallelism of the evaluation of the entire match circuit so that it can efficiently reduce the searching period and the switching activity. Thus, the switching caused by the transformation activity is also shortened. As a result, the match circuit device will not increase the loading of the clock signal so the power consumption is reduced significantly.

14 Claims, 10 Drawing Sheets

TREE-STYLE AND-TYPE MATCH CIRCUIT DEVICE APPLIED TO CONTENT ADDRESSABLE MEMORY

BACKGROUND

1. Field of Invention

The present invention relates to a logic circuit, and more particularly to a tree-style AND-type match circuit device applied to the content addressable memory.

2. Description of Related Art

The searching speed and power consumption of the content addressable memory (CAM) are affected by the match circuit. Match circuit designs are generally divided into NOR-type match circuit devices and NAND-type match circuit devices. NAND-type match circuit devices have lower power consumption but with slow searching speed; NOR-type match circuit devices have high searching speed but with high power consumption. Even though some methods like reducing the voltage swing and the direct current can improve the power consumption problem, these methods still cannot efficiently improve the power consumption problem of NOR-type match circuits.

Reference is made to FIG. 1, which illustrates a PF-CDPD (Pseudo-footless clock-and-data precharged dynamic) logic circuit in accordance with the prior art. The PF-CDPD logic circuit is used in the design of the match circuit 400 in the content addressable memory. In the scheme of the match circuit 400, a plurality of active AND logic gates 410 cascade in order. If one stage of these active AND logic gates 410 does not work, all the later logic gates do not act. This kind of circuit is similar to a NAND logic circuit so the power consumption is very low. Furthermore, all the gates G of the NMOS 411 are determined before the evaluation of the active AND logic gates 410 such that if the inputs of a single stage are all logic "1" (all the data of a single stage are matched successfully), the drain D and source S have zero potential, the same effect as grounding. Therefore, every stage of the PF-CDPD is like having only two inverters such that the searching speed is greatly enhanced. However, because the amount of the NMOS 411 stacked in each active AND logic gate 410 are limited by the charge sharing effect, the delay time of the match circuit 400 is still long because many cascaded stages are required for a match circuit.

Reference is made to FIG. 2, in order to solve the delay problem, one method is to draw out from the critical path of the match circuit with parallel-processing gates. Consequently, the evaluation speed of the new circuit path gets faster because the number of NMOS stacks is reduced. However, the method increases not only the loading of the clock signal but also the power consumption of content addressable memory.

Besides, the feature of the match circuit in FIG. 1 which determines the later stages act or not doesn't exist in the drawn out gates in FIG. 2, so the power consumption of the match circuit in FIG. 2 is larger than the power consumption of the match circuit in FIG. 1.

According to the aforementioned description, the match circuit 400 in FIG. 1 greatly reduces power consumption, but it suffers from the serious delay problem. On the other hand, the match circuit of FIG. 2 accelerates the evaluation speed, but it causes high power consumption problem. So, it is necessary to find an optimized solution to improve these two problems simultaneously.

SUMMARY

It is therefore an objective of the present invention to provide a tree-style AND-type match circuit device applied to content addressable memory in order to improve the slow searching speed problem of AND-type match circuit devices of content addressable memory.

It is another objective of the present invention to provide a tree-style AND-type match circuit device applied to content addressable memory in order to solve the large power consumption problem of NOR-type match circuits of content addressable memory.

In accordance with the foregoing and other objectives of the present invention, a tree-style AND-type match circuit device applied to content addressable memory is provided. Moreover, the AND-type match logic gate circuits branchingly connect with each other in this tree-style AND-type match circuit device.

In the preferred embodiment of the present invention, a plurality of AND-type match circuit groups branchingly connect with each other by a first AND logic gate so that it can boost the searching speed even over the searching speed of a NOR-type match circuit.

In the preferred embodiment of the present invention, the tree-style AND-type match circuit device applied to content addressable memory includes a CAM cell, a write/search buffer, an address decoder, a bit-line load and a match unit. The match unit comprises a plurality of AND-type match circuit groups, and a first AND logic gate branchingly connecting the AND-type match circuit groups with each other. Therefore, the circuit evaluation parallelism is raised while the loading of the clock signal won't be increased. Furthermore, the switching activity of the AND-type logic circuit will also be decreased. As a result, the tree-style AND-type match circuit greatly reduces the power consumption.

As embodied and broadly described herein, the invention provides some advantages, such as:

1. Raising the circuit evaluation parallelism to boost the searching speed of content addressable memory.

2. Decreasing the switching activity because of the decrement of the switching activity of the AND-type logic circuit. Therefore, power consumption is also reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
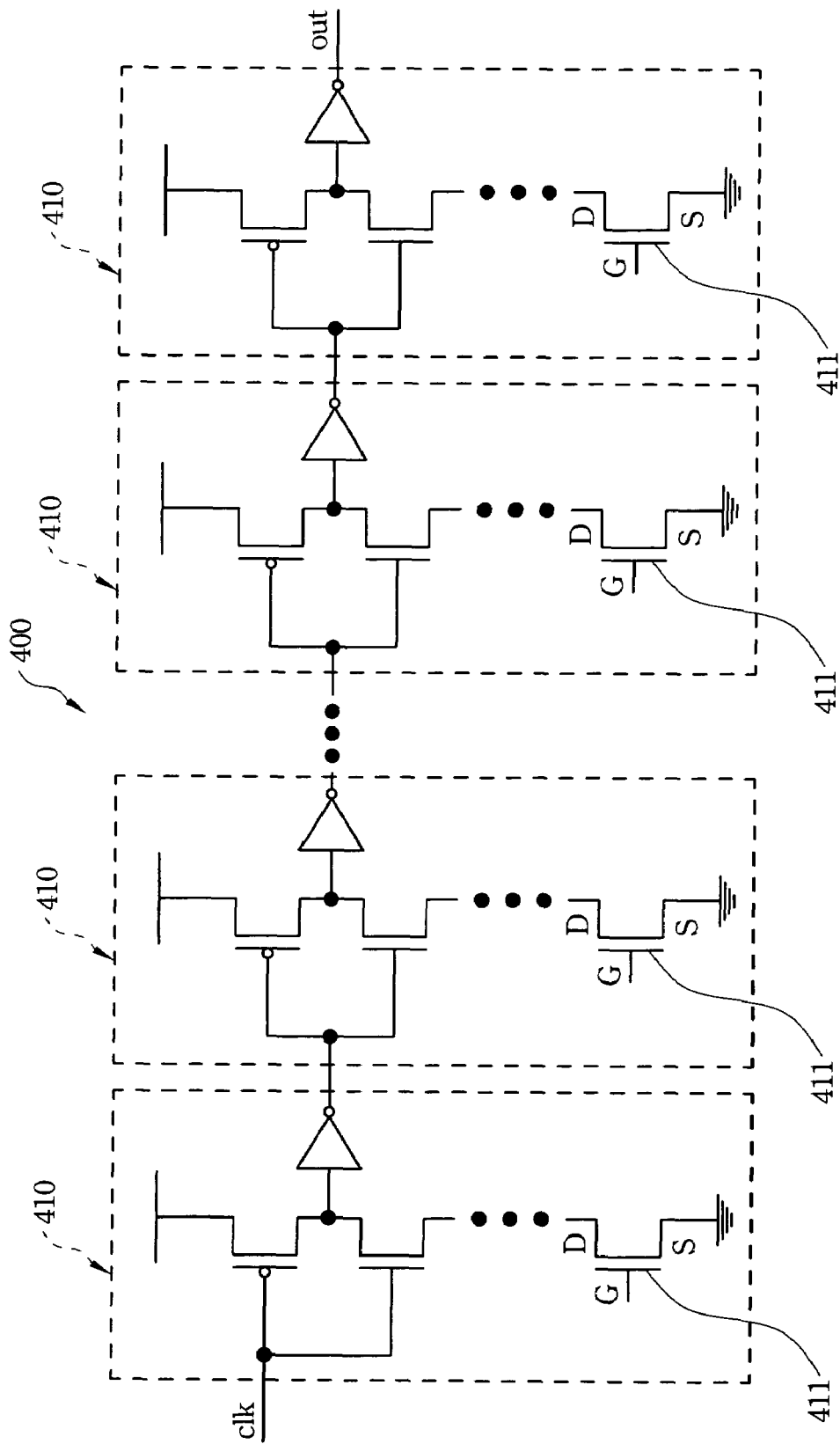
FIG. 1 is an AND-type circuit diagram of the PF-CDPD in accordance with the prior art.
Figure 2:
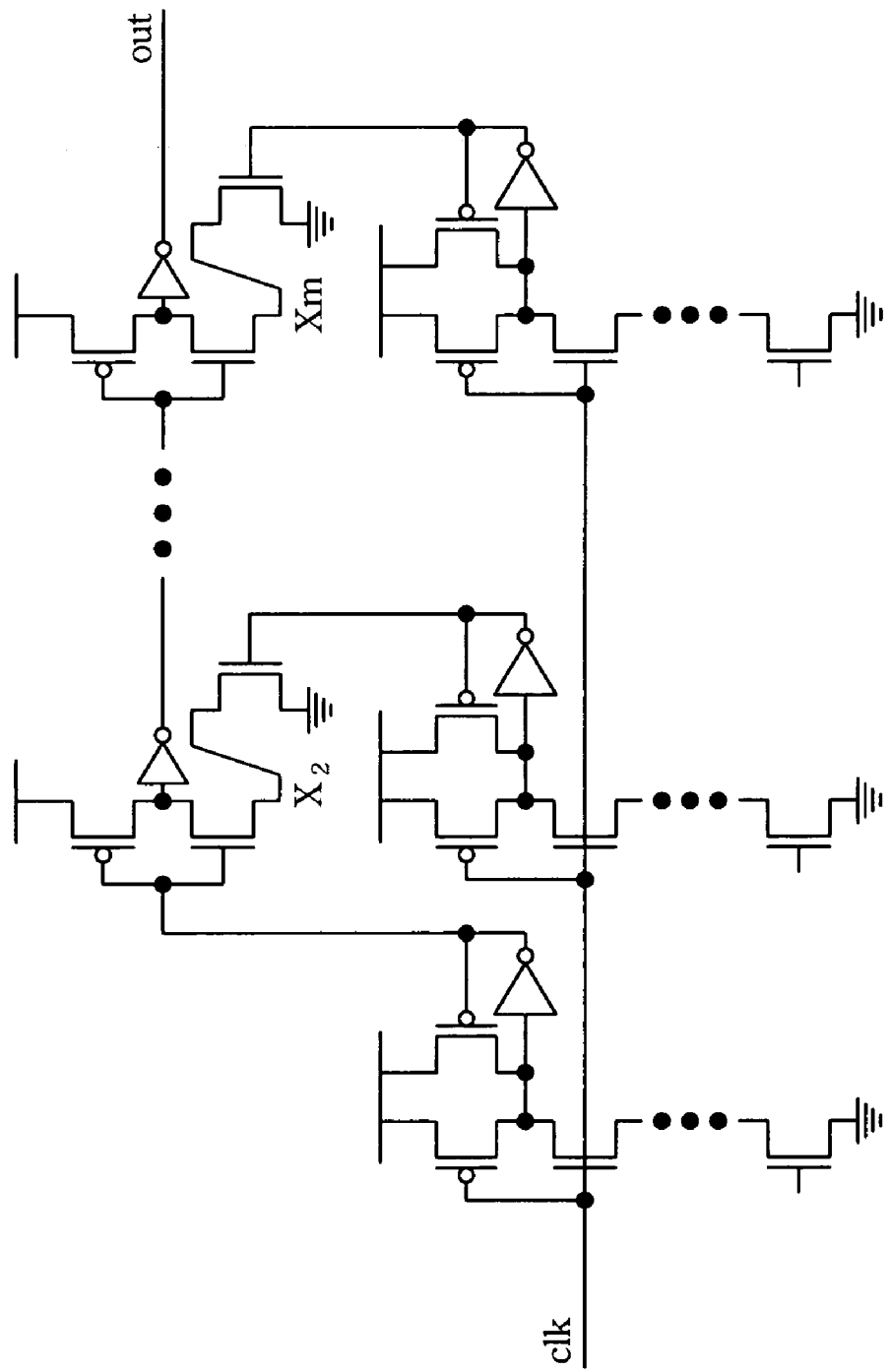
FIG. 2 is an accelerative AND-type circuit diagram of the PF-CDPD in accordance with the prior art.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Figure 3:
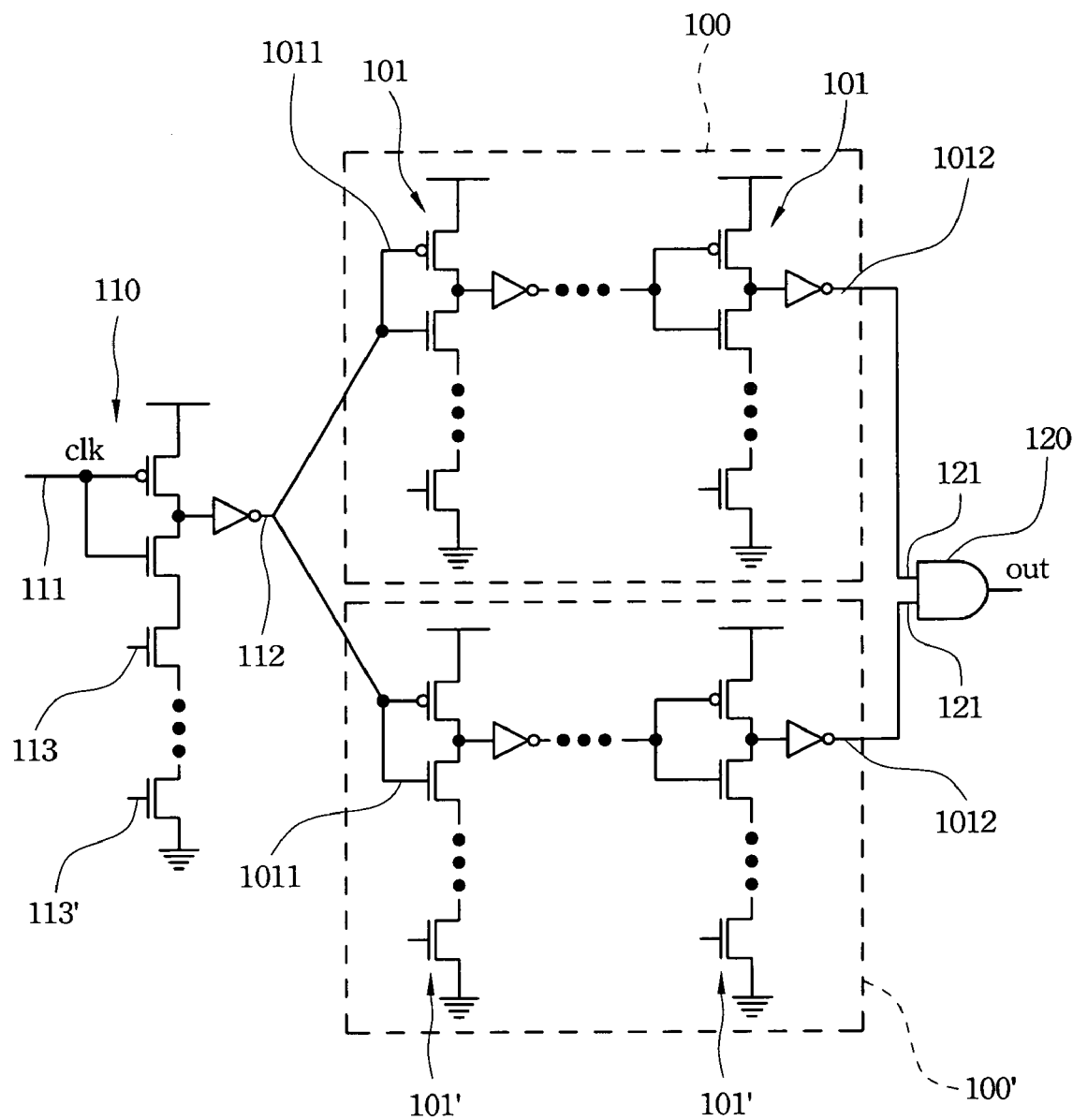
FIG. 3 illustrates a circuit diagram of a tree-style AND-type match circuit device applied to content addressable memory of the first preferred embodiment of the present invention.

Reference is made to FIG. 3, which illustrates a circuit diagram of the first preferred embodiment of the present invention.

The tree-style AND-type match circuit device applied to content addressable memory of the preferred embodiment of the present invention includes two AND-type match circuit groups 100 and 100', a first AND logic gate 110 and a second AND logic gate 120. The inputs of the AND-type match circuit groups 100 and 100' connect with the first AND logic gate 110, and the outputs of the AND-type match circuit groups 100 and 100' connect with the second AND logic gate 120.

The first AND logic gate 110 includes an input 111 and an output 112, wherein an external clock signal is fed-in the input 111. The other cell inputs 113 and 113' of the first logic gate connect with other cell outputs (not shown) in the same row of the content addressable memory.

The AND-type match circuit groups 100 and 100' connect with each other in parallel between the first AND logic gate 110 and the second AND logic 120. Furthermore, the AND-type match circuit groups 100 and 100' individually consists of a plurality of AND logic gates 101 and 101'. The inputs 1011 of the previous AND logic gate 101 and 101' connect with an output 112 of the first AND logic gate 110, and the outputs 1012 of the after AND logic gate 101 and 101' connect with an input 121 of the second AND logic gate 120.

The present invention improves the slow searching speed of NAND-type match circuits applied to content addressable memory by using the AND logic gates 110 and 120 to connect the two AND-type match circuit groups 100 and 100' with each other in parallel. In addition, the present invention also lowers the power consumption of NOR-type match circuits applied to content addressable memory because the clock signal load of the present invention doesn't increase. Therefore, the power consumption of content addressable memory of the present invention doesn't increase due to the augmentation of the parallelism. As a result, AND-type match circuit devices of the present invention can be applied to content addressable memory to achieve higher searching speed and lower power consumption.

Figure 4:
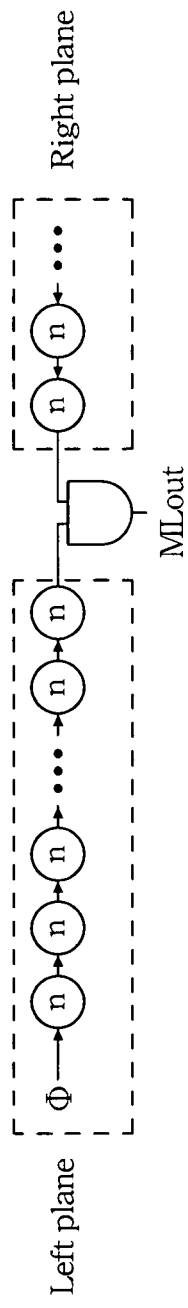
FIG. 4 illustrates a match circuit with single branch level in accordance with the prior art of FIG. 1.
Figure 7:
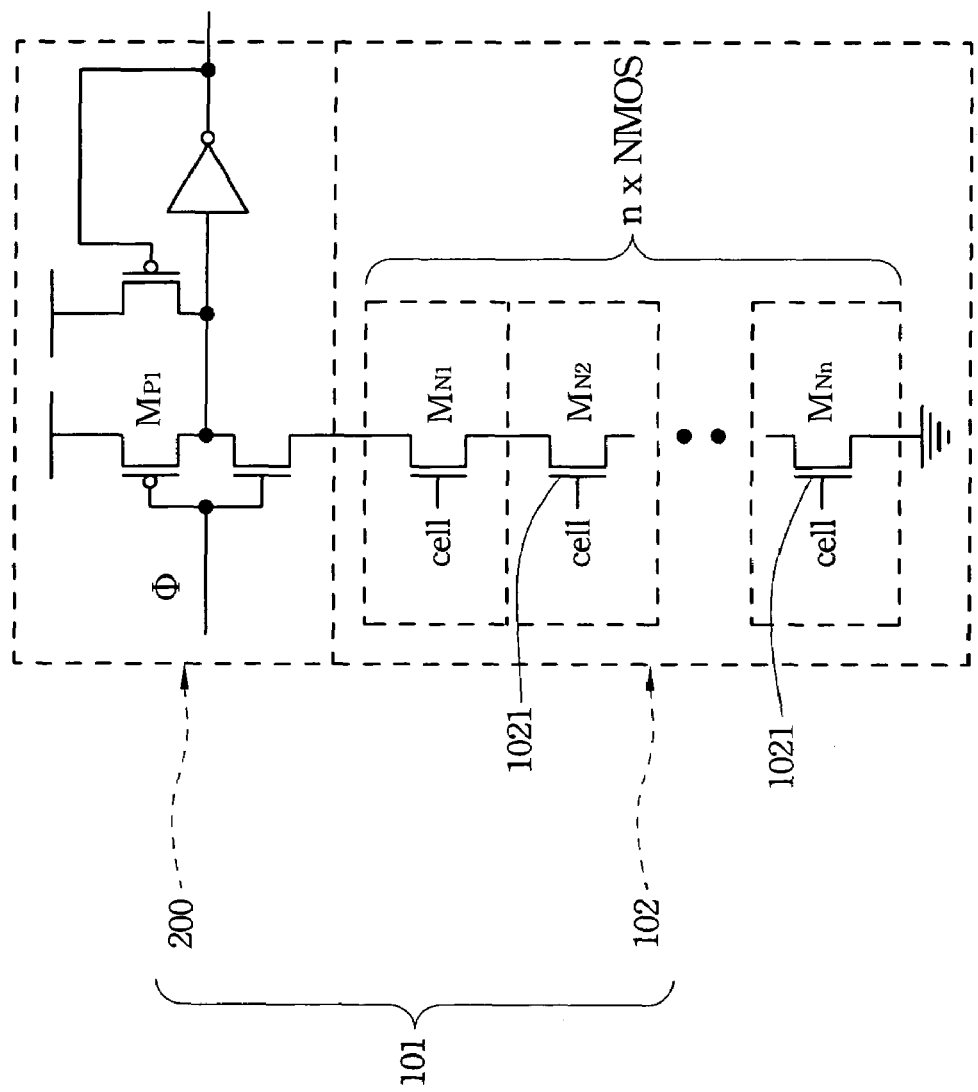
FIG. 7 illustrates an equivalent circuit of an AND-type match gate among FIG. 4, FIG. 5 and FIG. 6.

As the aforementioned statement, the present invention uses branch connections to reach the objectives and results. Reference is made to FIG. 4, the AND-type match circuit is a cascade match circuit, and the branch levels raise the parallelism of the AND-type match circuit. Each "n" denotes an AND logic gate in FIG. 4, and the equivalent "n" circuit is shown in FIG. 7. The load of the AND logic gate 101 in FIG. 7 is denoted by 200. The NMOS 1021 in cell 102 denotes the "n" cell amount. (This is described in more detail later.)

Figure 5:
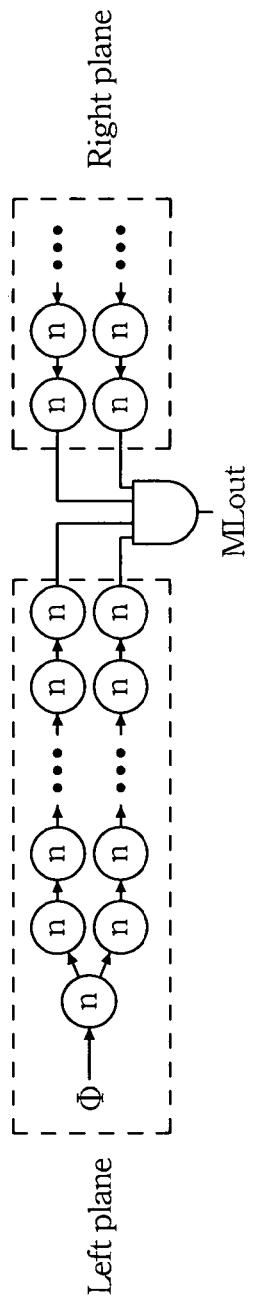
FIG. 5 illustrates a match circuit with two branch levels of the second preferred embodiment of the second present invention.
Figure 6:
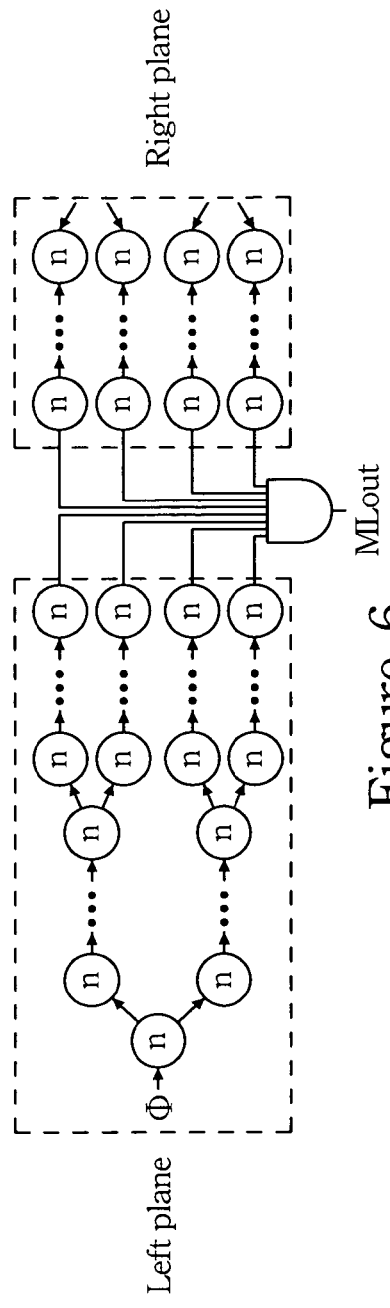
FIG. 6 illustrates a match circuit with three branch levels of the third preferred embodiment of the third present invention.

Reference is made to FIG. 5, which illustrates an embodied scheme that has two branch levels. Reference is made to FIG. 6, which illustrates an embodied scheme that has three branch levels. Thus, increased branch levels increase the parallelism and results in a faster searching speed. In FIG. 5 and FIG. 6, each "n" denotes an AND logic gate similar to FIG. 4.

Reference is made to FIG. 7, which illustrates the AND logic gate "n" of the first, second and third embodiments in FIG. 3, FIG. 5 and FIG. 6. FIG. 3, FIG. 4, FIG. 5 and FIG. 6 individually illustrate a single match line. Generally, there are thousands of data bits in the content addressable memory such that the load of the clock signal ($\Phi$) is very huge and the power consumption of the clock signal buffer is also enormous. The clock signal loads of the three schemes in FIG. 4, FIG. 5 and FIG. 6 are the same and are not increased such that the tree-style AND-type match circuit of the present invention can effectively reduce overall power consumption. In addition, each stage of tree-style AND-type match circuit acts or not depending on the match result of the previous stage; therefore, tree-style AND-type match circuits also lower the power consumption as the current NAND-type match circuits.

Figure 8:
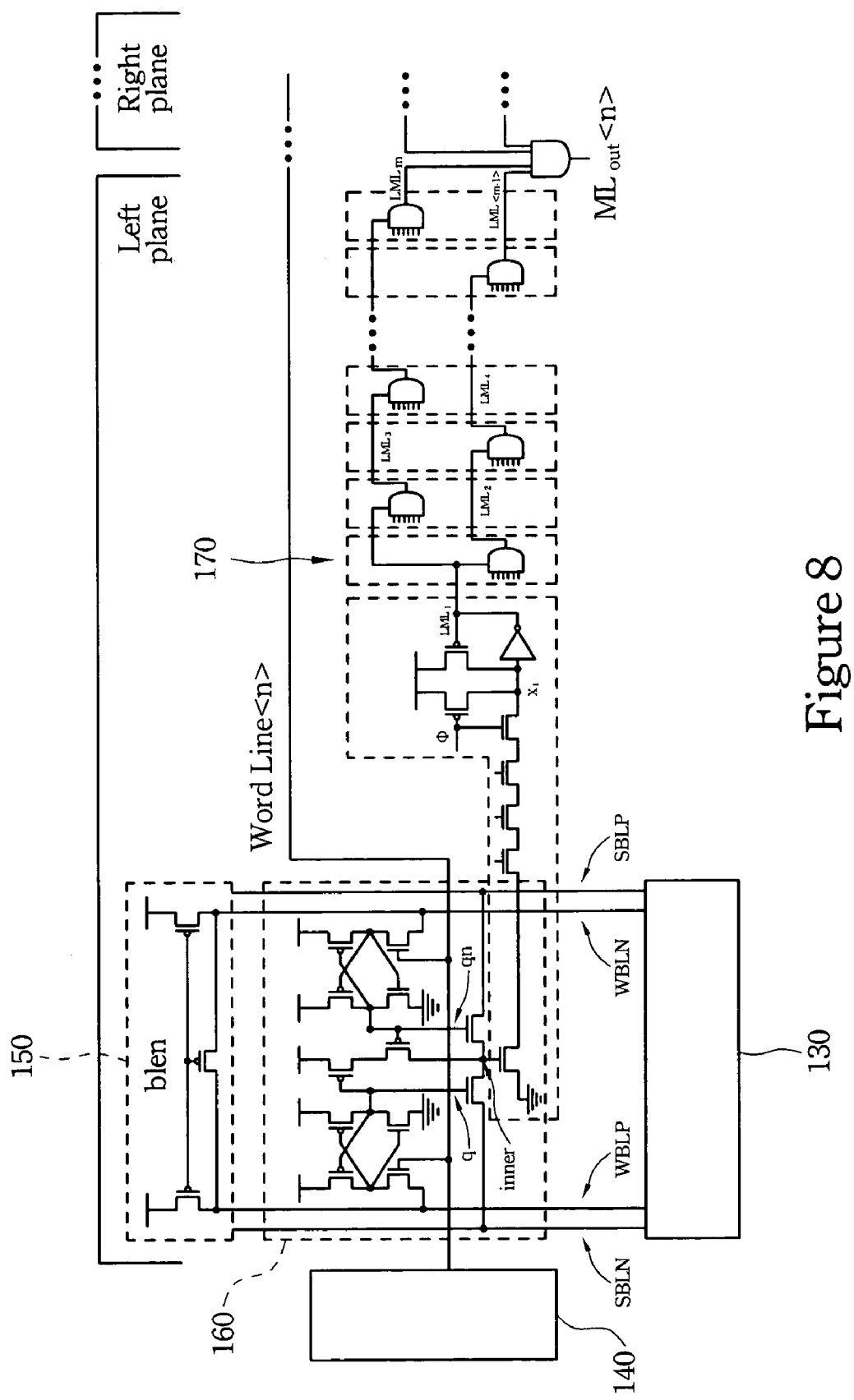
FIG. 8 illustrates a circuit scheme diagram of the tree-style AND-type match circuit applied to content addressable memory of the present invention.

Reference is made to FIG. 8, which illustrates a 128 bit wide scheme of content addressable memory of the preferred embodiment of the present invention. The content addressable memory comprises a write/search buffer 130, an address decoder 140, a bit-line load 150, a content addressable memory cell 160 and a match circuit 170. The write/search buffer 130, the address decoder 140, a bit-line load 150 and the match circuit 170 individually connect to the content addressable memory cell 160.

When CAM does the writing action, the "blen" point is high level, and the bit-line load 150 shuts down. Additionally, the bit-line load 150 precharges up the WBLP and WBLN. The write/search buffer 130 sends the data desired to be written into the content addressable memory 160 to the WBLP and WBLN. The address decoder 140 drives the selected word line to a high level after decoding such that the value of the WBLP and WBLN can be written into the content addressable memory 160. While the content addressable memory does the matching, the external data is sent to the SBLP and SBLN by the write/search buffer 130, and is compared with the value stored in the content addressable memory cell 160. If the value stored in the content addressable memory and the external data are the same, the inner point of the content addressable memory cell 160 is charged to a high level by the SBLP and SBLN.

Figure 9:
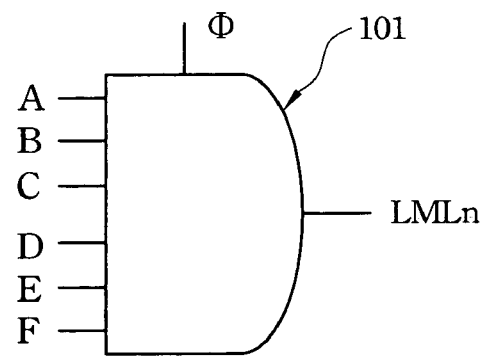
FIG. 9 illustrates an enlarged drawing of the AND logic gate in the match circuit in FIG. 8.
Figure 10:
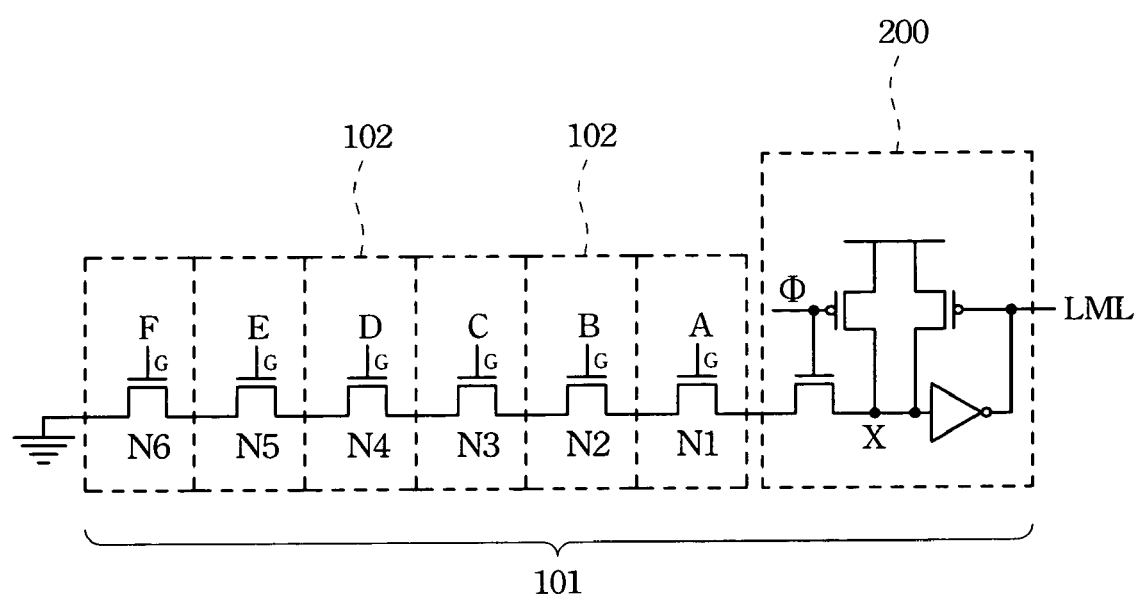
FIG. 10 illustrates an equivalent circuit diagram of the AND logic gate in FIG. 9.

Reference is made to FIG. 9 and FIG. 10, wherein FIG. 9 illustrates an enlarged drawing of a single AND logic gate of the match circuit in FIG. 8 and A, B, C, D, E, F individually stand for the output of a content addressable memory cell, and FIG. 10 illustrates an equivalent circuit diagram of the AND logic gate in FIG. 9. If the cell match results of each AND logic gate 101 are the same, the transistor gates (G) of N1, N2, N3, N4, N5 and N6 in the AND logic gate 101 are set at a high level. When the Φ of local match line (LML) is a high level, the output is also a high level to drive the evaluation of the next stage. As a result, $ML_{out}$ in FIG. 8 is a high level when the match results of the entire match line are the same.

Figure 11:
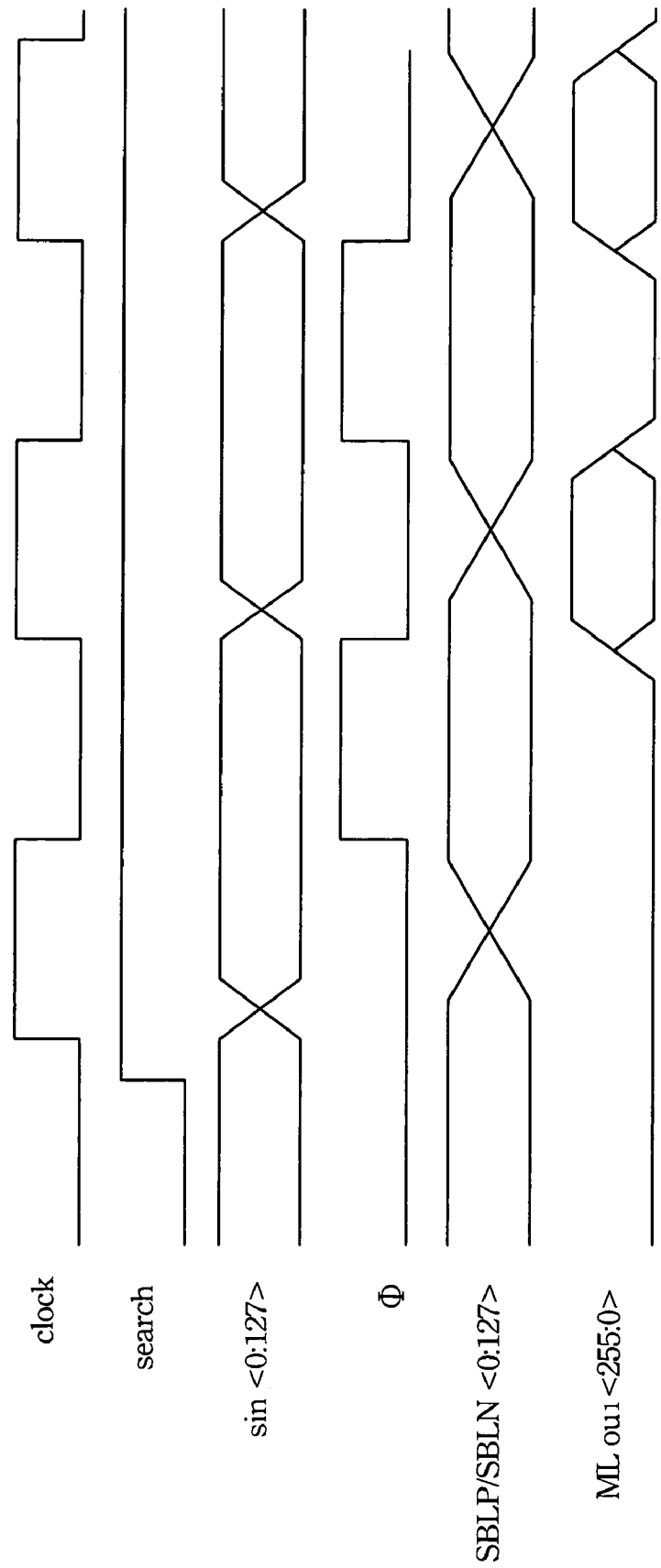
FIG. 11 illustrates a timing diagram of the preferred embodiment of the present invention.

Reference is made to FIG. 11, which illustrates the timing diagram of the content addressable memory in FIG. 8. When the external clock is a high level, Φ is a low level. The external data (sin<0: 127>) is sent to the SBLP and SBLN by the write/search buffer 130, and is compared with the stored data of each bit in the content addressable memory. When the clock is on the negative edge, Φ is on the positive edge. Meanwhile, the tree-style AND-type match line does the evaluation, and sends the bit match result of each stage to the next stage. At last, the match result of entire content addressable memory is output to $ML_{out}$<255:0>.

Figure 12:
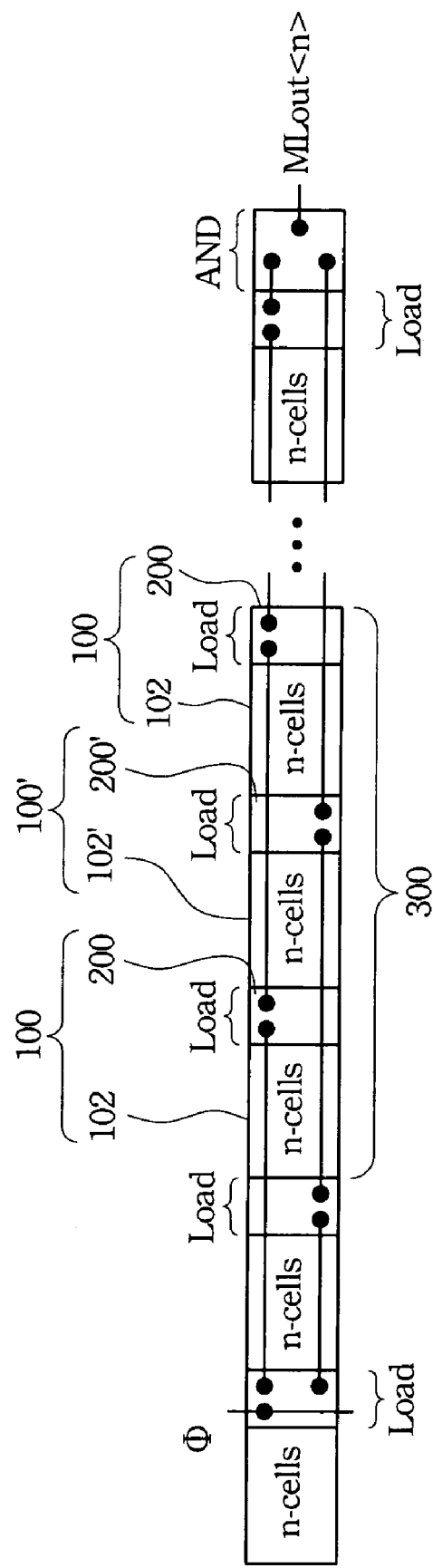
FIG. 12 illustrates a layout diagram implemented on the circuit board of the preferred embodiment of the present invention.
Figure 13:
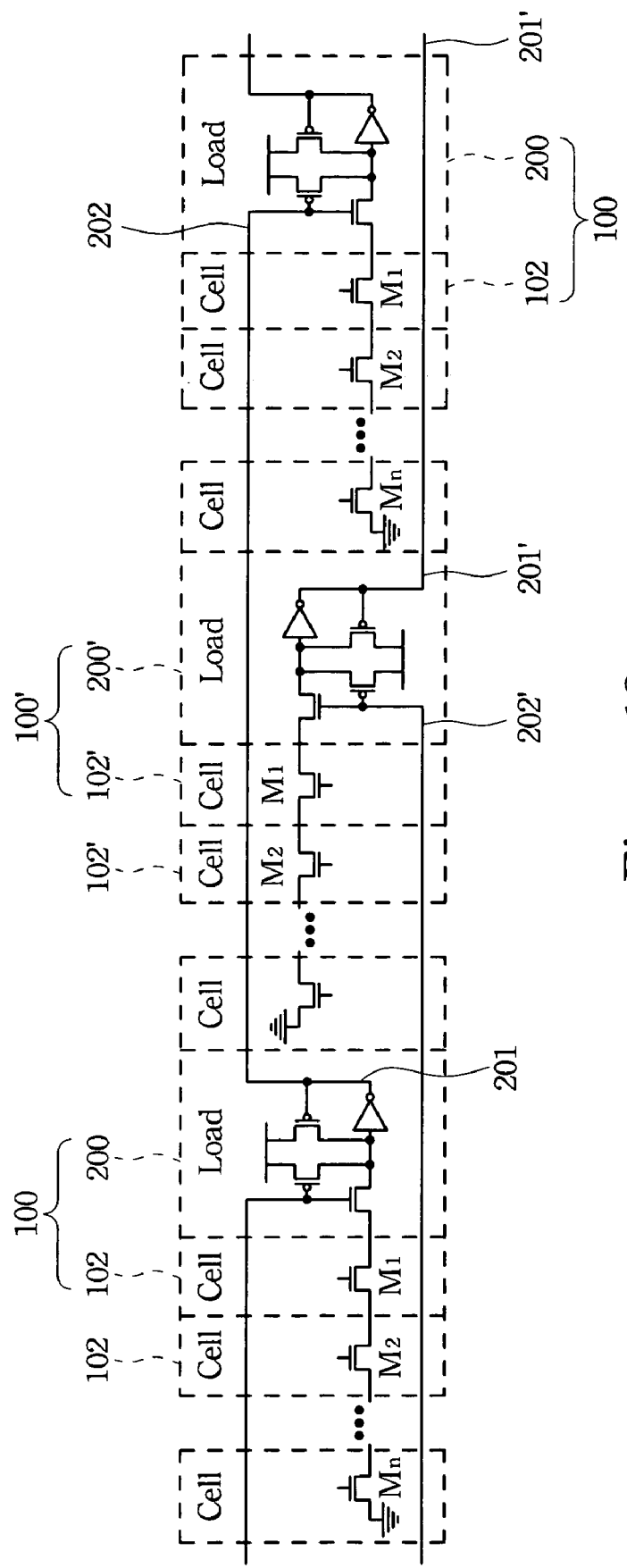
FIG. 13 illustrates a layout scheme of the three AND-type match circuits and loads with jumpers to connect in FIG. 12.

Reference is made to FIG. 12 and FIG. 13, wherein FIG. 12 illustrates a layout implemented on the circuit board of the tree-style AND-type match circuit of the preferred embodiment of the present invention and FIG. 13 illustrates the layout scheme of the range 300 in FIG. 12. The entire match circuit includes a plurality of AND logic gates 101 and 101', and each AND logic gate 101 and 101' further includes a plurality of cells 102, 102' and loads 200, 200' (reference to FIG. 10). The tree-style AND-type match circuits of the present invention sets each match circuit adjacently in an abutting configuration, and the match circuits of the different circuit groups connect with each other by the load 200 and 200'.

Furthermore, the connection manner of the different circuit groups is to make the load 200 and 200' alternately connect with each other with a jumper. In FIG. 13, an output 201 of the odd load 200 connects with an input 202 of the odd load 200, and an input 202' of the even load 200' connects with an output 201' of the even load 200'. Through this method, the AND-type match circuits, wherein each AND-type match circuit has a plurality of cells 102, 102' and loads 200, 200', of different groups can connect with each other adjacently.

This kind of layout whose cell and load are adjacent in FIG. 12 and FIG. 13 of the present invention makes the layout scheme concise and easy to implement. Besides, the LML uses the leap-frog jumper to make the stray capacitance be the same and also makes the delay time of each stage more similar.

According to the composition and the embodiments above, there are many advantages of the present invention, such as:

1. Compared with current NOR-type match circuits, the AND-type match circuit of the present invention can decrease the switching activity and reduce the overall power consumption.

2. The scheme of the tree-style AND-type match circuit of the present invention has lower power consumption and high searching speed because the load of the clock signal doesn't increase. Therefore, it is helpful for the content addressable memory to use this AND-type match circuit with lower power consumption and high searching speed.

3. The tree-style AND-type match circuits are set adjacently on the circuit board, and connected with each other by a leap-frog jumper in the circuit design. In this way, the tree-style AND-type match circuit is easy to implement and the layout regularity is raised. Therefore, the stray capacitances between the stages are the same in order to make the delay time of each stage more similar.

Moreover, because of the lower power consumption, higher searching speed of the tree-style AND-type match circuit device applied to the content addressable memory, the performances of the applications, such as the router, the hardware searching engine and the template matcher, are enhanced to boost the utilization.

Although the present invention has been described in considerable detail with reference to certain preferred embodiments thereof, other embodiments are possible. Therefore, their spirit and scope of the appended claims should no be limited to the description of the preferred embodiments container herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tree-style AND-type match circuit device applied to the content addressable memory, comprising:
   a plurality of AND-type match circuit groups;
   a first AND logic gate branchingly connecting the AND-type match circuit groups with each other, wherein a layout of each AND-type match circuit group is an abutting configuration; and
   a plurality of loads alternately connected with the AND-type match circuit groups.

2. The tree-style AND-type match circuit device applied to the content addressable memory of claim 1, wherein each of the AND-type match circuit groups includes a connecting branch level, and the connecting branch level is at least one level.

3. The tree-style AND-type match circuit device applied to the content addressable memory of claim 2, wherein the connecting branch level is two levels.

4. The tree-style AND-type match circuit device applied to the content addressable memory of claim 2, wherein the connecting branch level is three levels.

5. The tree-style AND-type match circuit device applied to the content addressable memory of claim 1, further comprising an output logic gate.

6. The tree-style AND-type match circuit device applied to the content addressable memory of claim 5, wherein each AND-type match circuit group includes a plurality of cascaded AND logic gates, and has an end AND logic gate connected with the output logic gate.

7. The tree-style AND-type match circuit device applied to the content addressable memory of claim 6, wherein the output logic gate is a second AND logic gate.

8. The tree-style AND-type match circuit device applied to the content addressable memory of claim 1, wherein each AND-type match circuit group includes a plurality of cascaded AND logic gates in order.

9. The tree-style AND-type match circuit device applied to the content addressable memory of claim 8, wherein each AND-type match circuit group connects in parallel with the first AND logic gate.

10. The tree-style AND-type match circuit device applied to the content addressable memory of claim 1, wherein the loads connect with an adjacent one of the AND-type match circuit groups.

11. The tree-style AND-type match circuit device applied to the content addressable memory of claim 10, wherein the loads connect with each other by a jumper.

12. The tree-style AND-type match circuit device applied to the content addressable memory of claim 1, wherein each load includes an input and an output.

13. The tree-style AND-type match circuit device applied to the content addressable memory of claim 12, wherein the inputs of the odd loads connect with the outputs of the odd loads.

14. The tree-style AND-type match circuit device applied to the content addressable memory of claim 12, wherein the inputs of the even loads connect with the outputs of the even loads.

* * * * *